United States Patent
Constantinescu et al.

(10) Patent No.: US 11,163,726 B2
(45) Date of Patent: Nov. 2, 2021

(54) CONTEXT AWARE DELTA ALGORITHM FOR GENOMIC FILES

(71) Applicant: INTERNATIONAL BUSINESS MACHINES CORPORATION, Armonk, NY (US)

(72) Inventors: Mihail Corneliu Constantinescu, San Jose, CA (US); Adyasha Maharana, Seattle, WA (US)

(73) Assignee: International Business Machines Corporation, Armonk, NY (US)

(*) Notice: Subject to any disclaimer, the term of this patent is extended or adjusted under 35 U.S.C. 154(b) by 664 days.

(21) Appl. No.: 15/693,019

(22) Filed: Aug. 31, 2017

(65) Prior Publication Data
US 2019/0065518 A1    Feb. 28, 2019

(51) Int. Cl.
*G06F 16/174* (2019.01)
*H03M 7/30* (2006.01)

(52) U.S. Cl.
CPC .......... *G06F 16/1744* (2019.01); *H03M 7/30* (2013.01)

(58) Field of Classification Search
CPC ...... G06F 16/1744; H03M 7/30; C12N 15/86; C12Q 1/6886; G16H 50/20
See application file for complete search history.

(56) References Cited

U.S. PATENT DOCUMENTS

| | | | |
|---|---|---|---|
| 7,657,383 B2 | 2/2010 | Allard et al. | |
| 8,340,914 B2 | 12/2012 | Gatewood et al. | |
| 8,972,201 B2 | 3/2015 | Mande et al. | |
| 2004/0086861 A1* | 5/2004 | Omori | H03M 13/00 435/6.14 |
| 2005/0267693 A1* | 12/2005 | Allard | G16B 50/00 702/20 |
| 2008/0077607 A1* | 3/2008 | Gatawood | G06F 16/22 |
| 2011/0119240 A1* | 5/2011 | Shapira | G06F 16/10 707/693 |
| 2011/0262903 A1 | 10/2011 | Davidson et al. | |
| 2012/0173159 A1 | 7/2012 | Davey et al. | |

(Continued)

FOREIGN PATENT DOCUMENTS

CN    103546160 A    1/2014

OTHER PUBLICATIONS

Google Search (Year: 2013).*

(Continued)

*Primary Examiner* — Mark D Featherstone
*Assistant Examiner* — Kweku William Halm
(74) *Attorney, Agent, or Firm* — Caleb D. Wilkes

(57) ABSTRACT

A method, computer system, and a computer program product for compressing at least one delta file for a plurality of genomic data files is provided. The present invention may include receiving the plurality of genomic data files as input. The present invention may also include determining a plurality of rows by traversing the received plurality of genomic data files. The present invention may then include comparing the plurality of rows associated with the traversed plurality of genomic data files. The present invention may further include generating a plurality of resulting delta files based on the compared plurality of rows. The present invention may also include compressing the generated plurality of resulting delta files by utilizing a general purpose file compressor.

20 Claims, 11 Drawing Sheets

(56) References Cited

U.S. PATENT DOCUMENTS

| | | | | |
|---|---|---|---|---|
| 2013/0132353 | A1* | 5/2013 | Mande | G16B 30/00 |
| | | | | 707/693 |
| 2013/0191351 | A1* | 7/2013 | Baym | H03M 7/3062 |
| | | | | 707/693 |
| 2014/0129529 | A1* | 5/2014 | Akelbein | G06F 16/16 |
| | | | | 707/693 |
| 2016/0306919 | A1 | 10/2016 | Ding et al. | |
| 2017/0185712 | A1* | 6/2017 | Karten | G06F 16/2228 |

OTHER PUBLICATIONS

Canovas et al. "Practical Compression for Multi-Alignment Genomic Files" Proceedings of the Thirty-Sixth Australasian Computer Science Conference (ACSC 2013) (Year: 2013).*

Molfetas et al., "Scalability in recursively stored delta compressed collections of files", AWC '14: Proceedings of the Second Australasian Web Conference—vol. 155Jan. 2014, pp. 21-29 (Year: 2014).*

Creative Commons Attribution-Noncommercial-Share Alike 3.0 New Zealand License. (Year: 2008).*

Brandon et al., "Data Structures and Compression Algorithms for Genomic Sequence Data," Bioinformatics, Jul. 15, 2009, p. 1731-1738, vol. 25, Issue 14, Oxford University Press.

Burns, "Differential Compression: A Generalized Solution for Binary Files," University of California Master Thesis, Dec. 1996, p. 1-61.

Mell et al., "The NIST Definition of Cloud Computing," National Institute of Standards and Technology, Sep. 2011, p. 1-3, Special Publication 800-145.

* cited by examiner

CONTEXT AWARE DELTA ALGORITHM FOR GENOMIC FILES

BACKGROUND

The present invention relates generally to the field of computing, and more particularly to computational biology.

Genome analysis pipelines (pipelines) involve multiple steps of pre-processing, variant discovery and call set refinement, in order to extract biologically meaningful output from raw sequence reads. At every such step, the pipeline generates output files, which range between megabytes to terabytes of size, depending on the size of the input sequence reads.

A review of these files reveals that not all the information saved to the output files at every step is newly generated. A sizable percentage of data is simply carried over from the input files into the output, creating an unnecessary strain on storage during the execution of the pipeline, and even afterwards. Each stage of the pipeline may take many hours or days so the intermediary files are kept for future investigations, changes or branches in the pipeline.

SUMMARY

Embodiments of the present invention disclose a method, computer system, and a computer program product for compressing at least one delta file for a plurality of genomic data files. The present invention may include receiving the plurality of genomic data files as input. The present invention may also include determining a plurality of rows by traversing the received plurality of genomic data files. The present invention may then include comparing the plurality of rows associated with the traversed plurality of genomic data files. The present invention may further include generating a plurality of resulting delta files based on the compared plurality of rows. The present invention may also include compressing the generated plurality of resulting delta files by utilizing a general purpose file compressor.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
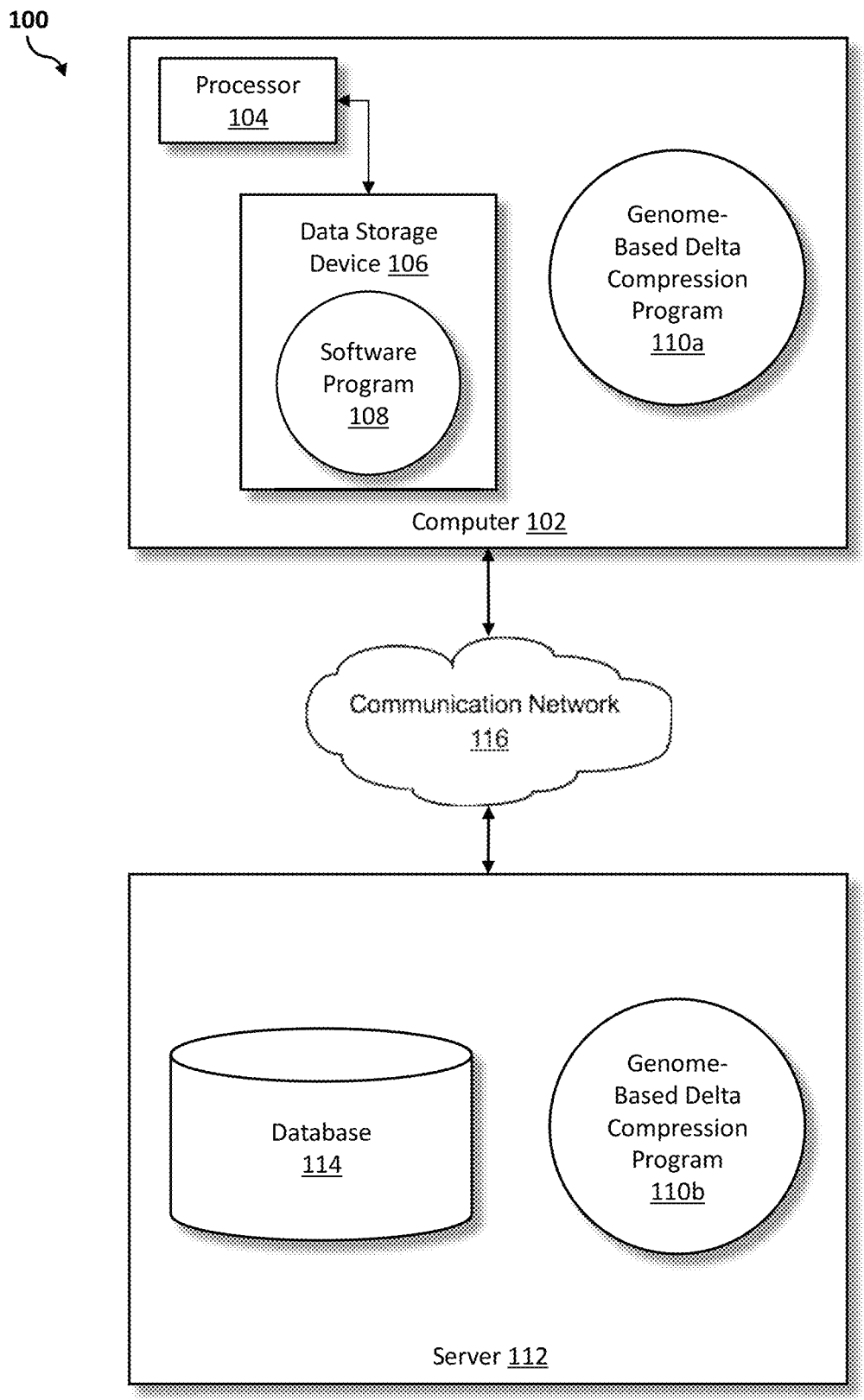
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product for compressing delta files for genomic data files. As such, the present embodiment has the capacity to improve the technical field of computational biology by reducing the storage footprint of the intermediary files produced by genomic analysis pipelines. More specifically, at least two genomic data files (e.g., at least one source file and one target file) may be entered into the genome-based delta compression program as input, and then, the genome-based delta compression program may sort the rows of the genomic data files utilizing known open source tools that may include sorting algorithms. The genome-based delta compression program may then sequentially traverse each row of the source and target files, and may compare the corresponding rows between the source and target files to generate a resulting delta file. Then, the genome-based delta compression program may compress the generated resulting delta file by utilizing a known general purpose file compressor.

As described previously, genome analysis pipelines (pipelines) involve multiple steps of pre-processing, variant discovery and call set refinement, in order to extract biologically meaningful output from raw sequence reads. At every such step, the pipeline generates output files, which range between megabytes to terabytes of size, depending on the size of the input sequence reads.

A review of these files reveals that not all the information saved to the output files at every step is newly generated. A sizable percentage of data is simply carried over from the input files into the output, creating an unnecessary strain on storage during the execution of the pipeline, and even afterwards. Each stage of the pipeline may take many hours or days so the intermediary files are kept for future investigations, changes or branches in the pipeline.

Delta or differential compression algorithms may exist (e.g., xdelta3 or vcdiff); however, these compression algorithms may be more effective when there are relatively large, contiguous common substrings between the source and target files. Genomic data with certain formats, such as Sequence Alignment/Map format (SAM) and Variant Call Format (VCF), may include relatively small records composed of fields, where some fields and sub-fields may differ from one version to the next.

Therefore, it may be advantageous to, among other things, create a data reduction method to minimize the storage footprint of, or the amount of repeated information in, the intermediary files produced by genomic analysis pipelines for small records.

According to at least one embodiment, the genome-based delta compression program may reduce the delta file (i.e., delta) between a pair of input and output files to a set of simple columnar operations such as Matches, Substitution, Insertion and Deletion. The source and target files may be parsed through rows with respective columns. The delta file may be a sequential account of the set of operations that may be performed on the source file to convert the source file into the target file. The resulting delta file may be compressed using a known general purpose file compressor, such as .zip (i.e., a file format and a software application used for file compression and decompression).

According to at least one embodiment, the genome-based delta compression program may enable storage and file systems, products, or cloud offerings to differentiate in the health care industry, supporting and running pipelines with smaller footprints and accelerating transfers over various communication networks. The genome-based delta compression program may also enable running alternative branches in the pipelines by restarting from various intermediary steps, and may enable a quicker check of hypotheses and variants.

According to at least one embodiment, genomic data files may be represented as a set of text rows (i.e., records) in which each includes a fixed number of columns or fields (e.g., TAB delimited, as in the SAM or VCF formats). By comparing the source and target files, the delta may be computed. Each of the rows of the source and target files may be sorted in increasing order of their mapping positions. Then, the source and target files may be traversed row-by-row in synch, and the corresponding rows with the same position may be compared in the source and target files resulting in a delta file. The resulting delta file may then be compressed using a general purpose compressor.

According to at least one embodiment, the genome-based delta compression program may take into account the fact that the source and target files may be sorted and mapped to a reference genome file. As such, the genome-based delta compression program may use a hierarchical identification system for two similar records between the source and target files. After the correct match is found, then both the records may be parsed into individual fields and compared on a field-by-field basis for the delta.

According to at least one embodiment, the genome-based delta compression program may improve row matching by buffering the rows in the target file mapped to the same position, and re-scanning the target files for the next rows in the source file at the same position. Each row in the genomic files may correspond to a "read" mapped to a reference genome. Generally, there may be many reads mapped to the same position in the reference genome. In fact, the average number of reads overlapping the same area of the genome may be the coverage factor. Coverage may be high at tens or even hundreds of reads that may be mapped to the same position.

According to at least one embodiment, a finer granularity (e.g., sub-column) may be used for finding deltas in columns that may have a smaller granularity predefined. The last columns of each record (i.e., row) in genomic formats may include a set of key-value pairs. Some new key-value pairs may be added or some may be deleted in the steps of the pipeline. As such, by using the smaller granularity, there may be smaller deltas.

According to at least one embodiment, the delta encoding (i.e., compression method) may store data in the form of differences between pairs of files. Even though several known delta compression algorithms (e.g., vcdiff and xdelta) exist that search for differences between sequential data, these known delta algorithms may generate larger resulting delta files than the actual difference when applied to genomic data files. These known delta algorithms may fail to leverage the advantages of a sorted order of genomic data files and TAB delimited structure of the rows. The files, including SAM and VCF format files, may include a plethora of auxiliary information in addition to nucleotide sequences and quality values that may be factored out in the genome-based delta compression program for efficient delta compression.

According to at least one embodiment, the design of the algorithm may be based on salient features of the pipelines and data files. The first step in a pipeline may be the sequence alignment, which may result in a SAM file, where every raw sequence read may be mapped to a specific position in the reference genome or left unmapped. The alignment position may stay the same throughout the rest of the pipeline, unless changed during realignment. Most pipeline tools may only sort files after the alignment step. The genome-based delta compression program may take advantage of the sorting to compute the difference between a pair of files synchronously. If the sorting order changes substantially between two files, the size of the delta may also increase. The genome-based delta compression program may detect if the delta may increase beyond an acceptable threshold. In such an instance, the genome-based delta compression program may abort the delta compression and leave the target file unchanged.

According to at least one embodiment, the genome-based delta compression program may quickly search over the headers of the source and target files, and reach the first record. For every individual record in the source file, there may be a corresponding action in the delta file. For every source record, the genome-based delta compression program may first attempt to find a match in the target file. The search window for finding this match may be limited to the records that carry the same value of reference sequence name (REF or RNAME) and 1-based leftmost mapping position (POS), in case of SAM, and chromosome identifier from the reference genome or an angle bracketed identifier string pointing to a contig (e.g., overlapping sequence data or reads) in the assembly file (#CHROM) and position (POS) in the case of VCF. The genome-based delta compression program may read the target file sequentially until a match may be found or the search window is exhausted. The unmatched records from the target file, which may be encountered during the search of a match for one source record, may be pushed to a buffer (e.g., small portion of memory where files may be temporarily stored) for the unmatched records to be processed again, when the genome-based delta compression program advances to the next record on the source file. If the number of records pushed to the buffer crosses an acceptable threshold, the genome-based delta compression program may abandon the search. If a match is not found, the source record may be marked as "Delete Record" in the delta file. While reading the target file sequentially, if the genome-based delta compression program encounters a record which has RNAME, POS or #CHROM, REF that may be smaller than that in the source record, then that particular record from the target file may be marked as "Insert Record" and may be added in the delta file.

According to at least one embodiment, the genome-based delta compression program may utilize a hierarchical identification system to match the source and target files based on certain columns. For example, in a SAM file, the genome-based delta compression program may utilize the columns associated with query template name (QNAME), bitwise flag (FLAG), RNAME, POS (i.e., the first to fourth columns) and, in a VCF file, the genome-based delta compression program may utilize the columns associated with #CHROM, POS, REF and alternate base(s) (ALT) (i.e., the first to second columns and the fourth to fifth columns).

According to at least one embodiment, after a match is determined between a source and target record, a field-by-field comparison may be performed for certain fields (e.g., the optional or non-mandatory fields (OPTIONAL) or twelfth column in a SAM file, and additional information (INFO) or eighth column in a VCF file). For the compared fields, when there is a mismatch in the field, that particular field may be marked as "Substitute" and the new value may be added in the delta file. The files excluded from comparison (e.g., OPTIONAL and INFO) may include several key-value pairs, or only keys and only values, which may be delimited by a semi-colon, white space or alternative marking. These fields excluded from comparison may then be parsed into their respective sub-fields for both target and source files. The key or values, which are present in the source and absent in the target, may be marked as "Delete" in the delta file. The key or value, which are present in the target and absent in the source, may be marked as "Insert" and may be added to the delta file. After the operations for a source record are decided and added to the delta file, the genome-based delta compression program may proceed to reading the next record in source file and may repeat the process again, unless the end-of-file (EOF) is encountered for both source and target. The generated delta file may be highly compressible and compressed for archival.

According to at least one embodiment, for every source record, the genome-based delta compression program may first search for matches in the buffer, before reading new records from the target file. The buffer may be cleared every time the search window changes. All unmatched records may be tagged as "Insert" and added to the delta.

Referring to FIG. 1, an exemplary networked computer environment 100 in accordance with one embodiment is depicted. The networked computer environment 100 may include a computer 102 with a processor 104 and a data storage device 106 that is enabled to run a software program 108 and a genome-based delta compression program 110a. The networked computer environment 100 may also include a server 112 that is enabled to run a genome-based delta compression program 110b that may interact with a database 114 and a communication network 116. The networked computer environment 100 may include a plurality of computers 102 and servers 112, only one of which is shown. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with the server computer 112 via the communications network 116. The communications network 116 may include connections, such as wire, wireless communication links, or fiber optic cables. As will be discussed with reference to FIG. 7, server computer 112 may include internal components 902a and external components 904a, respectively, and client computer 102 may include internal components 902b and external components 904b, respectively. Server computer 112 may also operate in a cloud computing service model, such as Software as a Service (SaaS), Platform as a Service (PaaS), or Infrastructure as a Service (IaaS). Server 112 may also be located in a cloud computing deployment model, such as a private cloud, community cloud, public cloud, or hybrid cloud. Client computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the genome-based delta compression program 110a, 110b may interact with a database 114 that may be embedded in various storage devices, such as, but not limited to a computer/mobile device 102, a networked server 112, or a cloud storage service.

According to the present embodiment, a user using a client computer 102 or a server computer 112 may use the genome-based delta compression program 110a, 110b (respectively) to compress delta files for genomic data files. The genome-based delta compression method is explained in more detail below with respect to FIGS. 2-6.

Figure 2:
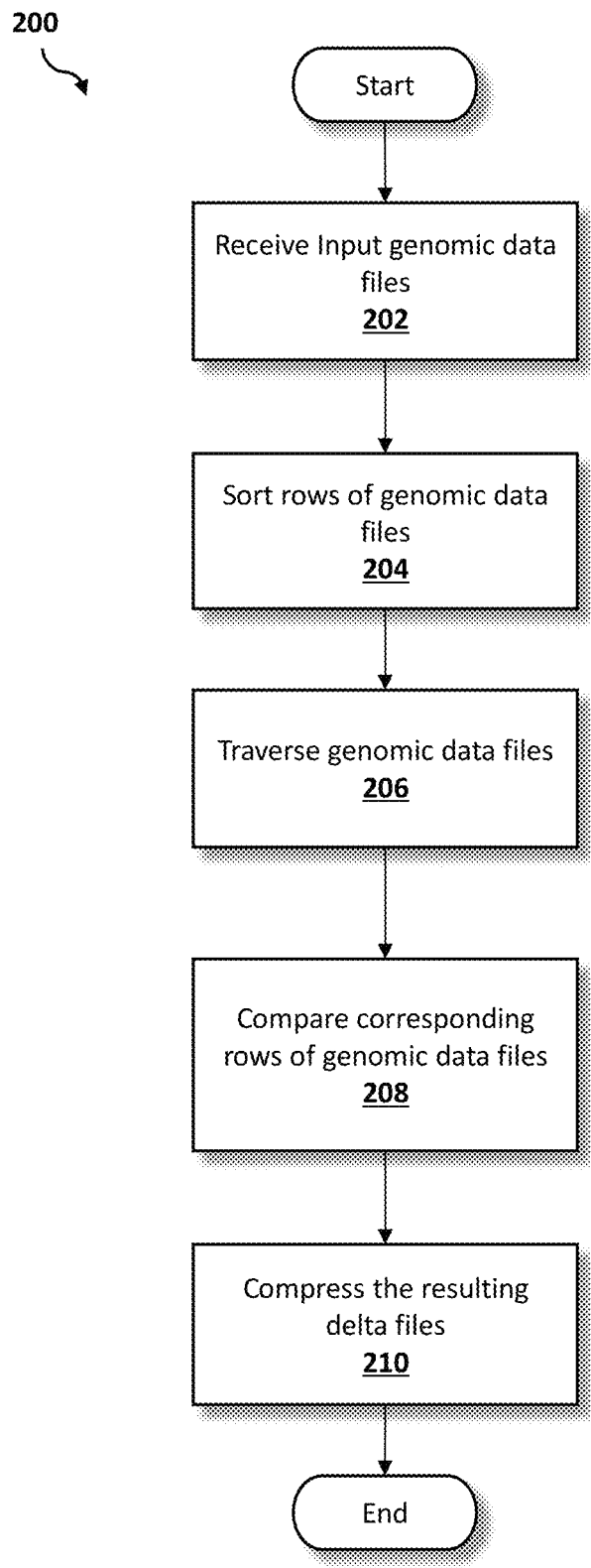
FIG. 2 is an operational flowchart illustrating a process for compressing delta files for genomic data files according to at least one embodiment.

Referring now to FIG. 2, an operational flowchart illustrating the exemplary compression process 200 for genomic data files used by the genome-based delta compression program 110a and 110b according to at least one embodiment is depicted.

At 202, genomic data files are received as input into the genome-based delta compression program 110a, 110b. Using a software program 108 on the user's device (e.g., user's computer 102), genomic data files may be transmitted as input into the genome-based delta compression program 110a, 110b via a communication network 116. Genomic data may include the genome data associated with an organism, and files on the genomic data may include deoxyribonucleic acid (DNA) sequence reads (i.e., precise order of the nucleotides within a DNA molecule), mappings to a reference genome and variations detected against the reference genome. The genomic data files may also include a set of rows (i.e., records) each including a fixed number of columns (i.e., fields) for at least two files, the source (i.e., reference) and target files. The source file is data that may be directly derived from the reference genome of an organism. Each file may be labelled depending on whether the file is a target or source file (e.g., "target_name.format type" or "source_name.format type"). The genome-based delta compression program 110a, 110b may utilize the source file to reconstruct the target file.

For example, the genome-based delta compression program 110a, 110b receives a source file (i.e., source_liverHS1567.sam) and target file (i.e., target_liverHS1567.sam) transmitted from a genome analysis toolkit (GATK). The source file includes data from a reference genome associated with a healthy human liver cell specimen, and the target file includes data associated with liver cell specimen from a human, who suffers from liver cancer. The exemplary compression process 300 for genomic data files, including the genome-based delta compression program 110a, 110b receiving the source and target files as input at 302, will be described in greater detail below with respect to FIG. 3A.

In the present embodiment, the genomic data files may be produced as output from the execution of the genomic analysis pipeline, such as GATK. The pipeline scripts may be enriched with specific commands for performing the genome-based delta compression program 110a, 110b with target and source files. Additionally, some of the output files (e.g., binary version of SAM (BAM) and VCF (BCF) files), which are compressed, may be uncompressed utilizing an external engine before initiating the genome-based delta compression program 110a, 110b.

In the present embodiment, the source and target files may be retrieved from files generated while running the pipeline from a folder or directory (i.e., database 114), where output files may be produced and stored.

In the present embodiment, if only one genomic data file is entered as input into the genome-based delta compression program 110a, 110b, then the genome-based delta compression program 110a, 110b may not compute a resulting delta file. Instead, the genome-based delta compression program 110a, 110b may return an error message to the user. The user may re-enter the same input file; however, the file should be entered with a corresponding source or target file for the genome-based delta compression program 110a, 110b to compute the resulting delta file.

Next at 204, the rows of genomic data files are sorted by the genome-based delta compression program 110a, 110b. The rows of the source and target files may be arranged in increasing order based on their mapping positions (POS) in the reference genome, which may narrow down the search window for matching rows between the source and target files, keep the buffer occupancy to a minimum and optimize running time of the genome-based delta compression program 110a, 110b. Known open source sorting tools, which includes known sorting algorithms, may be utilized to sort the rows for the rows of the genomic data files.

Depending on the format type of the target and source files, the files may have already been sorted in the pipeline. If the source and target files were sorted in the pipeline, then the target and source files may retain the sorted order in their respective rows when entered into the genome-based delta compression program 110a, 110b as input at 202.

Continuing the previous example, the genome-based delta compression program 110a, 110b determines that the source and target files obtained from GATK were previously sorted, and therefore, the genome-based delta compression program 110a, 110b does not have to sort the rows based on the mapping position (POS).

For purposes of this example, the genome-based delta compression program 110a, 110b is compatible with files in only SAM or VCF format. If the files are in any other format, then the user will be presented with an error message, and the genome-based delta compression program 110a, 110b stop running until compatible source and target files are entered as input. In this example, the genome-based delta compression program 110a, 110b determines that the source and target files are in SAM format, which is compatible with the genome-based delta compression program 110a, 110b.

As such, the genome-based delta compression program 110a, 110b initiates the buffer (i.e., small portions of memory that can store the target file if the target file fails to match the source file). The exemplary process for compressing delta files for genomic data files, including the genome-based delta compression program 110a, 110b checking the files to identify the format, and initializing (INIT) the buffer, will be described in greater detail below with respect to FIG. 3A.

If, however, the source and target files were not sorted prior to the genome-based delta compression program 110a, 110b receiving the files as input, then the genome-based delta compression program 110a, 110b may sort the rows of each of the source and target files in increasing order based on their POS (i.e., fourth column of the rows of each file) by utilizing open source sorting tools.

In the present embodiment, the genome-based delta compression program 110a, 110b may check the compatibility of the file format type (e.g., SAM, BAM, VCF, BCF). If the file format type is compatible with the genome-based delta compression program 110a, 110b, then the genome-based delta compression program 110a, 110b may proceed. If, however, the file format type is incompatible to the genome-based delta compression program 110a, 110b, then the genome-based delta compression program 110a, 110b may stop running and the user may be presented with an error message.

In the present embodiment, sorting algorithms, which may be utilized to sort through the rows of the genomic data files, may have to be modified depending on the complexity of the genomic data files.

Then at 206, the source and target files are traversed. The genome-based delta compression program 110a, 110b may traverse (i.e., read) the source and target files sequentially in which each line in the genomic data file may be interpreted as a row. The input files may be read by the genome-based delta compression program 110a, 110b until a newline character (i.e., a special character or sequence of characters signifying the end of a line and the start of a new line) is encountered. Further, the rows may be divided into columns (i.e., fields). To confirm that the two files are in synch, the values of the rows may be compared. Both files may be traversed in synchronization to compute the differences between the content of the files in a time and memory efficient way.

Continuing the previous example, the genome-based delta compression program 110a, 110b transverses each row of the source file. The source and target files include four rows with three pieces of data on each row. The block diagram comparing two genomic data files will be described in greater detail below with respect to FIG. 4. After traversing each row of the source file, the genome-based delta compression program 110a, 110b determines whether the buffer is empty (i.e., if the buffer is empty, then the target file may be read from the file instead of the buffer). For this example, the buffer is empty. Therefore, the genome-based delta compression program 110a, 110b traverses each target row from the target file. After the genome-based delta compression program 110a, 110b traverses each row of the source and target files, the genome-based delta compression program 110a, 110b confirms that the source and target files are in synch. The exemplary process for compressing delta files for genomic data files, including the genome-based delta compression program 110a, 110b reading the rows of the source and target files, will be described in greater detail below with respect to FIG. 3A.

Then at 208, the rows of the target and source files are compared. The genome-based delta compression program 110a, 110b may compare the corresponding rows (i.e., rows with the same mapping position) on the source and target files to determine any differences between the source and target files, and generate a resulting delta file (i.e., resulting D file).

The genome-based delta compression program 110a, 110b may perform a hierarchical field-wise comparison of partially matching rows (e.g., certain columns for each file are compared), and a full row comparison for matching rows (e.g., additional columns in both files are compared). The columns of the first file may be referred to as first columns, with each individual column of the first columns being a respective first column. The columns of the second file may be referred to as second columns, with each individual column of the second columns being a respective second column. The certain columns for each file that are compared in the hierarchical field-wise comparison may be referred to as priority columns for the first file and preeminent columns for the second file. The genome-based delta compression program 110a, 110b may be utilized to determine which comparison may be utilized depending on whether the compared rows are matching. The comparison of each row from the target and source files may be initiated with a field-wise comparison for certain columns. With each comparison during the hierarchical field-wise comparison, an intermediate match or mismatch may be recorded. At the end of the hierarchical field-wise comparison, there may be either a match or mismatch between the rows. The match or mismatch may be a quick way to determine whether the compared rows are in synchronization or not, and to determine whether there is a mismatch. If there is a match between the two rows, then a full row comparison (i.e., all columns are compared) may be performed. The results of the comparison may be captured in the resulting delta file, which is the output of the genome-based delta compression program 110a, 110b.

Continuing the previous example, the genome-based delta compression program 110a, 110b first performs a hierarchical field-wise comparison of each row within the target and source files. Since the source and target files are in SAM format, there are 11 fixed columns. The 11 fixed columns of the source file may be referred to as first columns. The 11 fixed columns of the target file may be referred to as second columns. However, the hierarchical field-wise comparison compares only four columns (i.e., POS, RNAME, QNAME and FLAG) (which for reference purposes may be referred to as priority columns for the first file and preeminent columns for the second file). The genome-based delta compression program 110a, 110b first compares the POS and RNAME columns of the first rows in the target and source files to determine whether the POS and RNAME columns match. Since the POS and RNAME columns of the first rows in the target and source files match, then the genome-based delta compression program 110a, 110b determines that there is an intermediate match, and then the QNAME columns of the same rows are compared. The genome-based delta compression program 110a, 110b determines that the QNAME columns for the same row matches, and that there is an intermediate match. The genome-based delta compression program 110a, 110b then compares the FLAG (bitwise) columns of the same rows. Since the FLAG (bitwise) columns of these rows do not match, the genome-based delta compression program 110a, 110b determines whether the difference between the FLAG (bitwise) columns of these rows is equal to or less than 0x400 (i.e., an optical duplicate). The genome-based delta compression program 110a, 110b determines that the difference was equal to 0x400. Therefore, the first rows of the target and source files match. An "m" is included in the first row of the D file created by the comparison of the source and target files. The genome-based delta compression program 110a, 110b may then proceed with the hierarchical field-wise comparison on the next row in the source and target files. The exemplary process for identifying the hierarchical structure of the genomic data files in SAM format will be described in greater detail below with respect to FIG. 5.

When the field-wise comparison of partially matching rows was performed, then the following results were generated and utilized to create the resulting D file:

when field_i(S) differs from field_i(T): DF←(field_i(T), i)

If the rows compared in the hierarchical field-wise comparison match, then the genome-based delta compression program 110a, 110b will perform a full row comparison, which includes the comparison of the OPTIONAL columns (i.e., the remaining optional or non-mandatory seven columns, or the twelfth column) including MAPQ (i.e., fifth column and mapping quality), CIGAR (i.e., sixth column and represents string operations associated with whether the sequence matches), RNEXT (i.e., seventh column and represents the reference name of the next read), PNEXT (i.e., eighth column and represents the position of the next read), TLEN (i.e., ninth column and represents the observed template length), SEQ (i.e., tenth column and represents the segment sequence) and QUAL (i.e., eleventh column and represents the base quality with a base error probability) in the rows of the target and source files, and parsing through the sub-fields of the OPTIONAL columns to compute the differences between the rows in the source and target files. The column differences are then added to the resulting file, and the genome-based delta compression program 110a, 110b reads the next row from the source file. The exemplary compression process 300 for genomic data files, including the process for hierarchical identification, for SAM format files will be described in greater detail below with respect to FIG. 3B.

Since the rows mismatch, a full-row comparison may not be performed. If, however, a full row comparison was performed, the following results may be generated:

match (D←"m"), delete (D←"d"), insert (D←T(i))

If, however, the source and target files were in VCF format, there are eight fixed and mandatory columns within each row. The eight fixed columns of the source file may be referred to as first columns. The eight fixed columns of the target file may be referred to as second columns. The hierarchical field-wise comparison compares only four columns (i.e., #CHROM, POS, REF and ALT) (which for reference purposes may be referred to as priority columns for the first file and preeminent columns for the second file). The genome-based delta compression program 110a, 110b first compares the #CHROM and POS columns of the first rows in the target and source files to determine whether the #CHROM and POS columns match. Depending on whether the genome-based delta compression program 110a, 110b determines that the #CHROM and POS columns are an intermediate match or a mismatch, then the REF and ALT columns of the same rows will be compared. The exemplary process for identifying the hierarchical structure of the genomic data files in VCF format will be described in greater detail below with respect to FIG. 6.

If the rows compared in the hierarchical field-wise comparison match, then the genome-based delta compression program 110a, 110b may perform a full row comparison, which includes the comparison of the INFO column (i.e., the eighth column that represents additional information) in the rows of the target and source files, and parsing through the sub-fields of the INFO column to compute the differences between the rows in the source and target files to create the resulting file. The genome-based delta compression program 110a, 110b then reads the next row from the source file. The exemplary compression process 300 for genomic data files, including the process for hierarchical identification, for VCF format files will be described in greater detail below with respect to FIG. 3C.

Then at 210, the resulting delta file is compressed using a known general purpose file compressor. The transmission of resulting delta file (i.e., resulting D file) to a general purpose file compressor may be automated with code for temporary changes to the resulting D file. After the compression of the resulting D file is completed, the genome-based delta compression program 110a, 110b may be saved on the memory of the user's device (e.g., user's computer 102). The genome-based delta compression program 110a, 110b may prompt (e.g., via dialog box) the user that the compressed resulting D file is completed. The dialog box may, for example, include a message that the compressed resulting D file is complete and a "View Details" button underneath the dialog box. Once the user clicks the "View Details" button, the dialog box disappears and another dialog box with the compressed resulting D file may be presented to the user. The resulting D file may be utilized with the source file to regenerate the target file.

Continuing the previous example, the resulting D file generated by the comparisons of the source and the target file (i.e., the source file was utilized to reconstruct the target file as a resulting D file) is compressed by .zip. The resulting delta file was reduced by 52% of the original size, and the compressed resulting D file is saved onto the memory of the user's computer (i.e., user device 102). The user is prompted by a dialog box that the compressed resulting D file is complete, and the user clicks on the "View Details" button underneath the message. Once the user clicks the "View Details" button, then the dialog box disappears, and another dialog box appears, which presents the compressed resulting D file to the user.

Figure 3A:
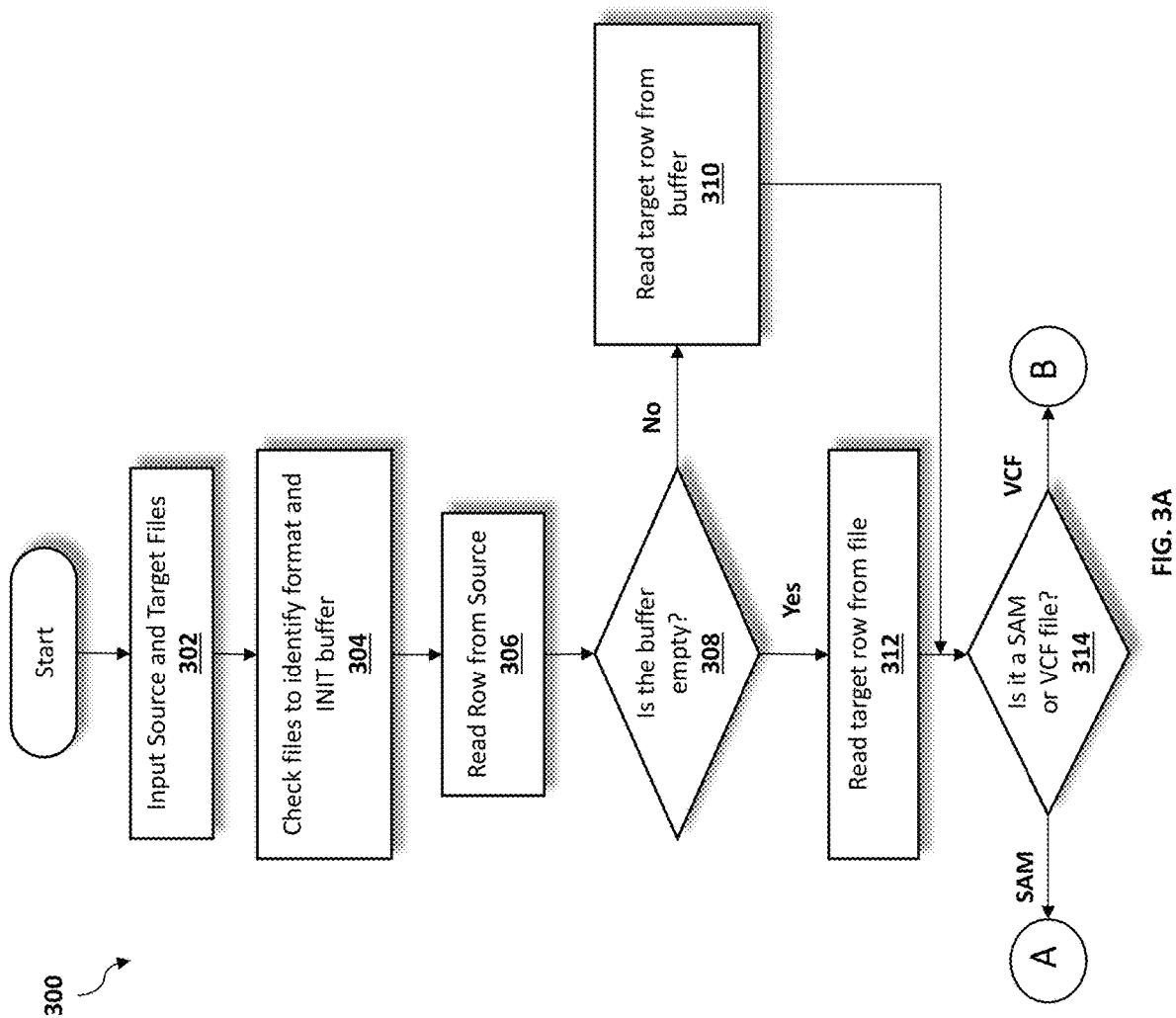
FIG. 3A is an operational flowchart illustrating an exemplary process for compressing delta files for genomic data files according to at least one embodiment.

Referring now to FIG. 3A, an operational flowchart illustrating the exemplary compression process 300 for genomic data files used by the genome-based delta compression program 110a and 110b according to at least one embodiment is depicted. As shown, the genome-based delta compression program 110a, 110b utilizes source and target files to create D files and a general purpose file compressor to compress the resulting D file.

At 302, the source and target files are entered into the genome-based delta compression program 110a, 110b as an input. Using a software program 108 on the user's device (e.g., user's computer 102), source and target files may be transmitted as input into the genome-based delta compression program 110a, 110b via a communication network 116. Each file may be labelled to indicate whether the file is a source or target file. As such, the genome-based delta compression program 110a, 110b may be able to identify the type of file (i.e., whether the file is a source or target file) that is transmitted.

For example, the genome-based delta compression program 110a, 110b receives a source file and target file transmitted from a genomic analysis toolkit (GATK). The source file includes data from a reference genome associated with a healthy Asian Tiger mosquito, and the target file includes data associated with the genome of an Asian Tiger mosquito infected with the West Nile Virus (i.e., Flavivirus).

Next, at 304, the genome-based delta compression program 110a, 110b checks the files to identify the format and initializes a buffer (INIT buffer). The genome-based delta compression program 110a, 110b may check that the source and target files are in compatible formats (e.g., SAM or VCF). Then, the genome-based delta compression program 110a, 110b may initialize the buffer, which may be a small portion of memory that may store rows from the target file until matching rows from the source file are found by the genome-based delta compression program 110a, 110b. Continuing the previous example, the genome-based delta compression program 110a, 110b confirmed that the received source and target files are in VCF format. Additionally, the genome-based delta compression program 110a, 110b initiates the buffer.

Then, at 306, a row from the source file is read. Depending on format type and whether the files were retrieved from pipelines, the rows of the respective files may already be sorted, and as such, the genome-based delta compression program 110a, 110b may proceed with traversing (or reading) the source file. Continuing the previous example, the genome-based delta compression program 110a, 110b determines that the source and target files were already sorted in a pipeline prior to transmission to the genome-based delta compression program 110a, 110b. As such, the received source and target files do not have to be sorted prior to the genome-based delta compression program 110a, 110b reading the received source file row. As such, the genome-based delta compression program 110a, 110b may proceed with reading the first row from the source file.

If the genome-based delta compression program 110a, 110b determines that the buffer is empty (e.g., no target files are within the buffer) at 308, then the genome-based delta compression program 110a, 110b may read the target row from the target file at 312. The genome-based delta compression program 110a, 110b searches the buffer to determine whether any target rows are in the buffer. If there are no target rows in the buffer, then the genome-based delta compression program 110a, 110b determines that the buffer is empty.

If, however, the buffer is not empty (e.g., the buffer includes at least one target row) at 308, then the target row is read from the buffer at 310. If target rows are present in the buffer, then the genome-based delta compression program 110a, 110b determines that the buffer is not empty.

Continuing the previous example, the genome-based delta compression program 110a, 110b determines that the buffer is not empty and includes three target rows. As such, one of the target rows is read from the buffer.

If the genome-based delta compression program 110a, 110b read the target row from the buffer at 310, or read the target row from the target file at 312, then the genome-based delta compression program 110a, 110b determines whether the format for the source and target files are SAM or VCF at 314. After the genome-based delta compression program 110a, 110b has read both the source and target files, then the genome-based delta compression program 110a, 110b proceeds to the creation and compression of the resulting D file, which differs depending on the format type. If the genome-based delta compression program 110a, 110b determines that the files are in SAM format at 314, then the genome-based delta compression program 110a, 110b proceeds to FIG. 3B. If, however, the genome-based delta compression program 110a, 110b determines that the files are in VCF format at 314, then the genome-based delta compression program 110a, 110b proceeds to FIG. 3C.

Figure 3B:
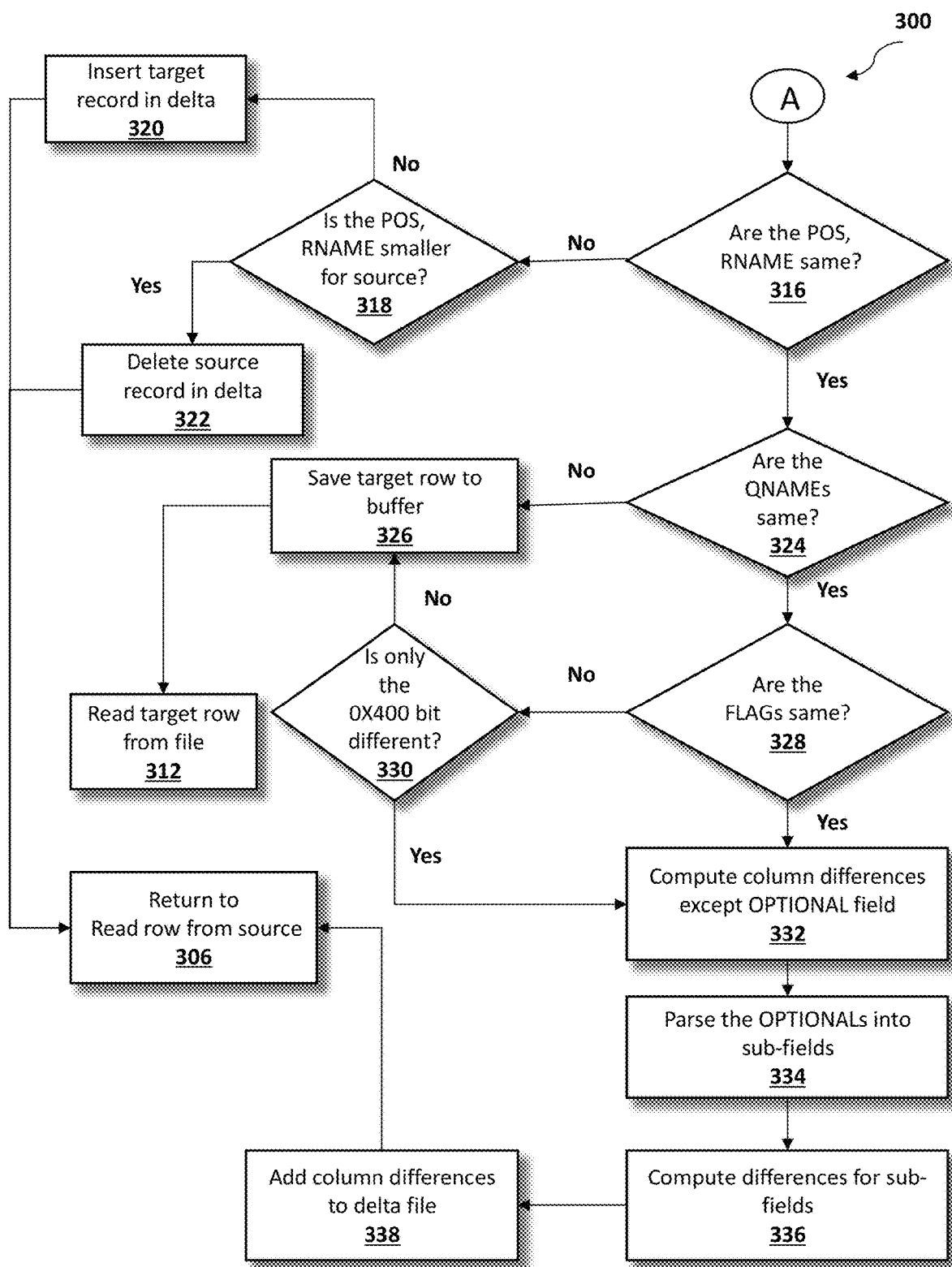
FIG. 3B is an operational flowchart illustrating an exemplary process for compressing delta files for genomic data files in Sequence Alignment/Map format (SAM) according to at least one embodiment.
Figure 3C:
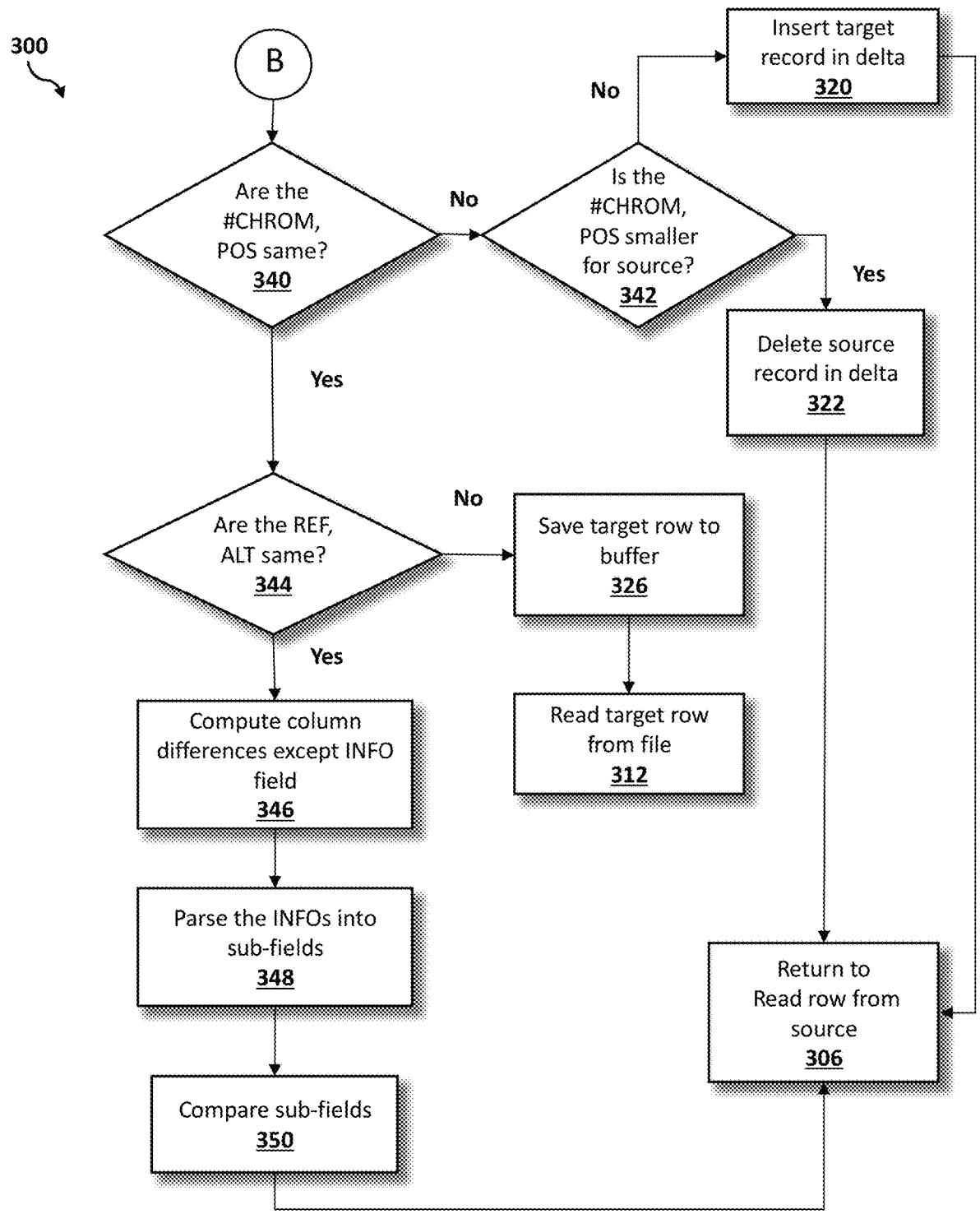
FIG. 3C is an operational flowchart illustrating an exemplary process for compressing delta files for genomic data files in Variant Call Format (VCF) according to at least one embodiment.

Continuing the previous example, the genome-based delta compression program 110a, 110b confirms that both source and target files are in VCF format, and then the genome-based delta compression program 110a, 110b proceeds to FIG. 3C.

Referring now to FIG. 3B, an operational flowchart illustrating the exemplary compression process 300 for genomic data files in SAM format used by the genome-based delta compression program 110a and 110b according to at least one embodiment is depicted. A comparison of the fields within the rows of the source and target files in SAM format is shown. In FIG. 3B, the source and target files are in SAM format.

If the genome-based delta compression program 110a, 110b determines that the POS and RNAME are not the same at 316, then, at 318, the genome-based delta compression program 110a, 110b determines whether the POS and RNAME of the source file are smaller than the POS and RNAME of the target file, respectively. Each row of the source and target files in SAM format may be evaluated by the genome-based delta compression program 110a, 110b to determine whether the POS and RNAME are the same.

If the source and target files were in SAM format, then the genome-based delta compression program 110a, 110b may evaluate the first row of the source and target files to determine whether the POS and RNAME for each file are the same. If the POS and RNAME for the source and target files are the same, respectively, then the genome-based delta compression program 110a, 110b may evaluate whether the QNAMEs for the source and target files are the same. If, however, the POS and RNAME for the source and target files are not the same, then the genome-based delta compression program 110a, 110b may determine whether the POS and RNAME for the source file are smaller than the target file.

If the genome-based delta compression program 110a, 110b determines that the POS and RNAME of the source file are larger than that in the target file at 318, then, at 320, the genome-based delta compression program 110a, 110b inserts the target record in the delta and returns to read the next row from the source file at 306. Therefore, if the POS and RNAME of the rows in the source file are larger than that in the target file, then the target record may be included in the resulting delta file. Continuing the previous example, if the POS and RNAME of the source file are larger than that of the target file, then the POS and RNAME of the target record may be inserted in the delta. Therefore, the target record may be inserted in that row of the resulting delta file.

If, however, the genome-based delta compression program 110a, 110b determines that the POS and RNAME of the source file row are smaller than the corresponding row in target file at 318, then, at 322, the corresponding row is deleted in the delta and the genome-based delta compression program 110a, 110b returns to read the next row from the source file at 306. Continuing the previous example, if the POS and RNAME of the source file are smaller than that of the target file, then, the source record may be deleted from the resulting delta. As such, the delta may have a "d" in that row of the resulting delta file instead of the source record.

If, however, the genome-based delta compression program 110a, 110b determines that POS and RNAME of the row in the source file are the same as the corresponding row in the target file at 316, then, at 324, the rows are evaluated to determine whether the QNAMEs for each are the same. Continuing the previous example, if the corresponding rows of the received source and target files have the same POS and RNAME, then the genome-based delta compression program 110a, 110b may determine whether the QNAMEs for the corresponding rows of the received source and target files are the same.

If the genome-based delta compression program 110a, 110b determines that the QNAMEs of the source and target file rows are not the same at 324, then, at 326, the row from the target file is saved to the buffer and the genome-based delta compression program 110a, 110b returns to read the next target row from the file at 312. Continuing the previous example, if the QNAMEs for the corresponding rows of the target and source files are not the same (i.e., different), the target row is saved in the buffer until a better match for the target row is determined.

If, however, the genome-based delta compression program 110a, 110b determines that the QNAMEs for each row are the same at 324, then, at 328, the row of the target and source files are evaluated to determine whether the FLAGs are the same. Continuing the previous example, if the QNAMEs for the corresponding rows of the source and target files are the same, then the genome-based delta compression program 110a, 110b compares the FLAGs (bitwise) for the corresponding rows of the received source and target files.

If the genome-based delta compression program 110a, 110b determines that the FLAGs for each row are not the same at 328, then, at 330, the genome-based delta compression program 110a, 110b determines whether the difference is equal to or less than the threshold value (e.g., 0x400). If the difference is larger than the threshold value (e.g., 0x400) at 330, then, at 326, the row from the target file is saved to the buffer and the genome-based delta compression program 110a, 110b returns to 312 to read the target row from the file. Continuing the previous example, if the FLAGs (bitwise) for each of the corresponding rows of the received source and target file differs, then the genome-based delta compression program 110a, 110b may determine whether the difference is equal to or less than the threshold value. The threshold value may be predetermined by the user, and in this example, a threshold value of 0x400 (i.e., optical duplicate) was previously selected by the user. As such, the genome-based delta compression program 110a, 110b may determine whether the FLAGs (bitwise) difference is equal to or less than 0x400.

If, however, the genome-based delta compression program 110a, 110b determines that the difference is equal to or less than the threshold value (e.g., 0x400) at 330, or if the genome-based delta compression program 110a, 110b determines that the FLAGs for the rows of the target and source files are the same at 328, then genome-based delta compression program 110a, 110b computes the column differences, except the OPTIONAL field at 332. The genome-based delta compression program 110a, 110b may search for column differences and then indicate which of the columns include such differences. Depending on the location of the different columns and the extent of the column difference, the records within the resulting delta file may be affected. Continuing the previous example, if the genome-based delta compression program 110a, 110b determines that the difference between the corresponding row of the received source and target files are equal to or less than 0x400 or that the FLAGs (bitwise) of the corresponding rows of the received source and target files are the same, then the genome-based delta compression program 110a, 110b may proceed to computing the column differences, excluding the OPTIONAL field.

Then, at 334, the genome-based delta compression program 110a, 110b parses the OPTIONAL field into the sub-field. The OPTIONAL sub-fields may be included in the alignment records of the SAM format file, which may include more than twenty predefined standard tags that may be parsed by the genome-based delta compression program 110a, 110b to determine the similarities or differences between the OPTIONAL sub-fields of corresponding rows of the source and target files. Continuing the previous example, the genome-based delta compression program 110a, 110b may search through the OPTIONAL field and the predefined standard tags in the sub-fields within the OPTIONAL fields to determine whether any similarities or differences exist between the corresponding rows of the received source and target files.

Then, at 336, the differences of the sub-fields for each row of the target and source files are computed. The genome-based delta compression program 110a, 110b may then search through the differences in the OPTIONAL sub-fields for each row of the target and source files, and may indicate which the sub-fields are different for each row of the target and source files. Depending on the extent of the difference, the records within the resulting delta file may be affected. Continuing the previous example, the genome-based delta compression program 110a, 110b may compute the differences between the OPTIONAL sub-fields for the corresponding rows to the received source and target files.

Then, at 338, the genome-based delta compression program 110a, 110b adds the column differences to the delta file and the genome-based delta compression program 110a, 110b returns to read the next row from the source file at 306. The genome-based delta compression program 110a, 110b continues to loop through the exemplary compression process 300 for genomic data files until the shortest of the source and target files end. Continuing the previous example, the genome-based delta compression program 110a, 110b adds the column differences to the resulting delta file, and returns to 306 to read the next corresponding row for the received source file.

Referring now to FIG. 3C, an operational flowchart illustrating the exemplary compression process 300 for genomic data files in VCF format used by the genome-based delta compression program 110a and 110b according to at least one embodiment is depicted. The comparison of the fields within the rows of the source and target files in VCF format is shown. In FIG. 3C, the source and target files are in VCF format.

If the genome-based delta compression program 110a, 110b determines that the #CHROM and POS are not the same at 340, then, at 342, the genome-based delta compression program 110a, 110b determines whether the #CHROM and POS of the source file row is smaller than the target file row. If the genome-based delta compression program 110a, 110b determines that the #CHROM and POS of the source file row is larger than the target file row at 342, then, at 320, the genome-based delta compression program 110a, 110b inserts the target record in the delta and returns to read the row from the source at 306.

If, however, the genome-based delta compression program 110a, 110b determines that the #CHROM and POS of the source file row is smaller than the corresponding row in the target file at 342, then, at 322, the corresponding row is deleted in the delta and the genome-based delta compression program 110a, 110b returns to read the next row from the source file at 306.

If, however, the genome-based delta compression program 110a, 110b determines that the #CHROM and POS for each row of the source and target files are the same at 340, then, at 344, the genome-based delta compression program 110a, 110b determines whether the REF and ALT for each row of the source and target files are the same. Continuing the previous example, the received source and target files were previously determined to be in VCF format. As such, the genome-based delta compression program 110a, 110b proceeded to FIG. 3C in which the first rows of the received source and target files are evaluated to determine whether the #CHROM and POS are the same. The #CHROM for the corresponding row of the received source and target files is 21, and POS for each row is 3. Therefore, the #CHROM and POS for the corresponding rows of the source and target files are the same, and the genome-based delta compression program 110a, 110b proceeds to 344 to determine whether the REF, ALT in the source file row is the same as the corresponding row in the target file.

If the genome-based delta compression program 110a, 110b determines that the REF and ALT of the source and target file rows are not the same at 344, then, at 326, the row from the target file is saved to the buffer and the genome-based delta compression program 110a, 110b returns to 312 to read the target row from the file.

If, however, the genome-based delta compression program 110a, 110b determines that the REF and ALT of the source and target file rows are the same at 344, then, at 346, the genome-based delta compression program 110a, 110b computes the column differences, except the INFO field. The genome-based delta compression program 110a, 110b may search for column differences and then indicate which of the columns include such differences. Depending on the location of the different columns and the extent of the column difference, the records within the resulting delta file may be affected. Continuing the previous example, the REF for both rows are G and the ALT for both rows are C. As such, the genome-based delta compression program 110a, 110b determines that the ALT and REF for both rows of the received source and target files are the same. Since the REF and ALT of the source and target file rows are the same, the genome-based delta compression program 110a, 110b searches through all the eight mandatory fixed columns included in the source and target files in VCF format to compute any column differences. The genome-based delta compression program 110a, 110b generates several differences in two columns, ID and QUAL.

Then, at 348, the genome-based delta compression program 110a, 110b parses the INFO field into the sub-field. The INFO field (i.e., eighth column of the VCF file) may include additional information on the source or target file, which may be searched to determine the similarities and differences between each row of the source and target files. Continuing the previous example, the genome-based delta compression program 110a, 110b searches through the INFO or eighth column of the source and target file rows in VCF format. The format of each INFO sub-field in the source file row is specified in the meta-information as DP=154; MQ=52; H2. However, the format of each INFO sub-field in the target file row is DP=159; MQ=79; H2.

Then, at 350, the genome-based delta compression program 110a, 110b compares the sub-fields for each row of the target and source files and returns to read the next row from the source file at 306. The genome-based delta compression program 110a, 110b continues to loop through 300 until the shortest of the source and target files end. Continuing the previous example, the genome-based delta compression program 110a, 110b compares the sub-fields to compute the differences, which are inserted into the resulting delta file.

Then, the genome-based delta compression program 110a, 110b returns to 306 to read the next row of the received source file.

Figure 4:
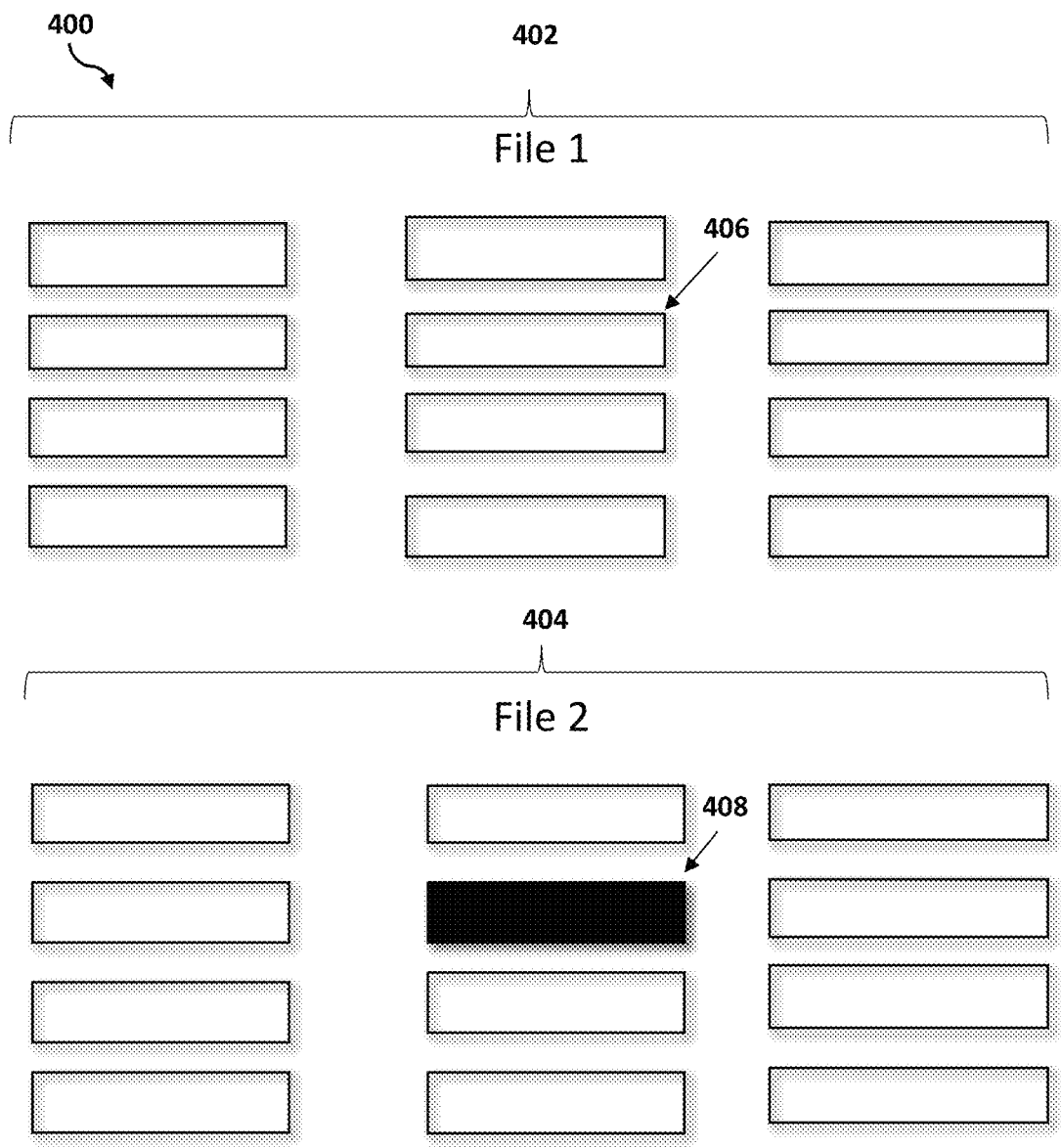
FIG. 4 is a block diagram illustrating an exemplary process for comparing of two genomic data files according to at least one embodiment.

Referring now to FIG. 4, a block diagram illustrating an exemplary process of comparing genomic data files 400 used by the genome-based delta compression program 110a and 110b according to at least one embodiment is depicted. As shown, the files 402 and 404 for genomic data may be organized in a set of rows and columns.

File 1 at 402 is the source file, and File 2 at 404 is the target file. As the genome-based delta compression program 110a, 110b compares the two files, row-by-row indicators based on the mapping position of 402 compared to the mapping positions of 404 are utilized. The genome-based delta compression program 110a, 110b may determine that there is a difference between the two files when comparing the data included in one of the records of source file 406 with another record in the target file 408. Although FIG. 4 indicates the difference with color, the difference may include dissimilar data within the records. As such, the genome-based delta compression program 110a, 110b may write the following results for the resulting D file:

Delta: <Match Row>
    <$2^{nd}$ column - substitution> <new value>
    <Match Row>
    <Match Row>

Therefore, except the new value in 408, the source file 402 and target file 404 are the same and match each other in three out of four of the compared rows.

Figure 5:
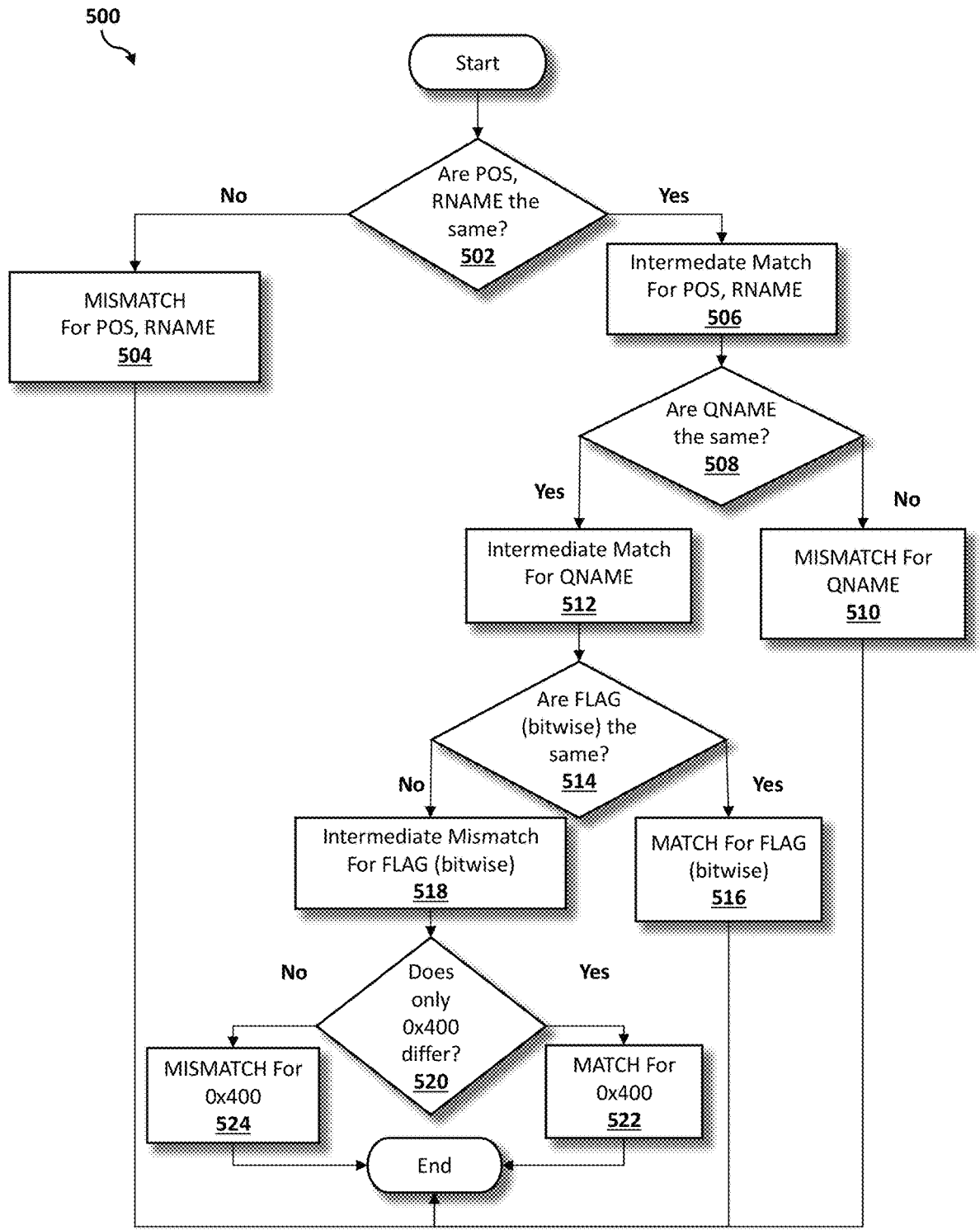
FIG. 5 is an operational flowchart illustrating an exemplary process for identifying the hierarchical structure of the genomic data files in Sequence Alignment/Map format (SAM) according to at least one embodiment.

Referring now to FIG. 5, an operational flowchart illustrating the exemplary process for identifying the hierarchical structure of the genomic data files in SAM format 500 used by the genome-based delta compression program 110a and 110b according to at least one embodiment is depicted. As shown, the genome-based delta compression program 110a, 110b utilizes a hierarchical system of identification when comparing rows of target and source files for SAM records.

If the genome-based delta compression program 110a, 110b determines that the POS and RNAME of the corresponding rows do not match (i.e., mismatch) at 502, then the target and source files are determined to mismatch at 504 and the comparison of the target and source files ends. The genome-based delta compression program 110a, 110b compares the POS and RNAME of each row in the target and source files to determine if POS, RNAME are the same.

If, however, the genome-based delta compression program 110a, 110b determines that the POS and RNAME fields/columns match, respectively, at 502, then the genome-based delta compression program 110a, 110b determines that the target and source file rows are an intermediate match at 506 and the genome-based delta compression program 110a, 110b moves down the row to compare the QNAME of the next row of the source and target files at 508.

If the genome-based delta compression program 110a, 110b determines that the QNAME of the rows do not match at 508, then the target and source files are determined to mismatch at 510 and the comparison of the rows of the target and source files ends. If, however, the genome-based delta compression program 110a, 110b determines that the QNAME matches at 508, then the genome-based delta compression program 110a, 110b determines that the target and source file rows are an intermediate match at 512 and the genome-based delta compression program 110a, 110b moves down the row to compare the FLAG (bitwise) of the source and target files at 514.

If the genome-based delta compression program 110a, 110b determines that the FLAG (bitwise) of the rows matches at 514, then the genome-based delta compression program 110a, 110b determines that the target and source file rows are a match at 516 and proceeds to the more complex operational flowchart in FIG. 3B.

If, however, the genome-based delta compression program 110a, 110b determines that the FLAG (bitwise) does not match at 514, then the genome-based delta compression program 110a, 110b determines that the source and target file rows are an intermediate mismatch at 518, and the genome-based delta compression program 110a, 110b may compare the rows to determine whether the difference is equal to or less than a threshold value (e.g., 0x400) at 520. If the difference is equal to or less than the threshold value at 520, then the target and source file rows are considered to match at 522 and a "m" for match is written in the resulting delta file. If, however, the difference is greater than the threshold value at 520, then the source and target file rows are determined to mismatch at 524 and the hierarchical identification of the source and target file rows ends.

Figure 6:
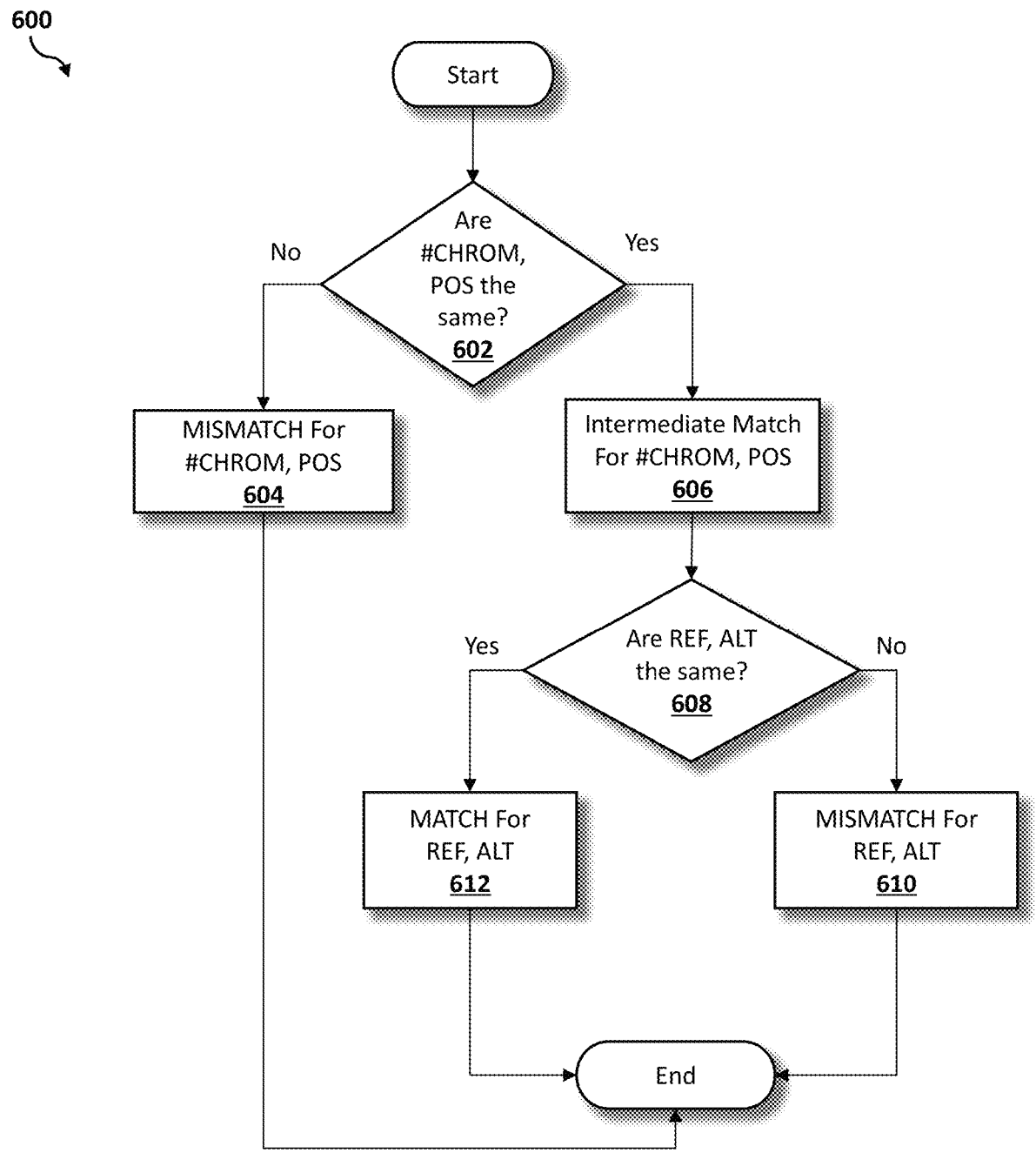
FIG. 6 is an operational flowchart illustrating an exemplary process for identifying the hierarchical structure of the genomic data files in Variant Call Format (VCF) according to at least one embodiment.

Referring now to FIG. 6, an operational flowchart illustrating the simple exemplary process for identifying the hierarchical structure of the genomic data files in VCF format 600 used by the genome-based delta compression program 110a and 110b according to at least one embodiment is depicted. As shown, the genome-based delta compression program 110a, 110b utilizes a hierarchical system of identification when comparing rows of target and source files for VCF records.

If the genome-based delta compression program 110a, 110b determines that the #CHROM and POS of the row does not match (i.e., mismatch) at 602, then the target and source files are determined as a mismatch at 604 and the comparison of the target and source files ends. The genome-based delta compression program 110a, 110b compares the #CHROM and POS of each row in the target and source files.

If, however, the genome-based delta compression program 110a, 110b determines that the #CHROM and POS match at 602, then the target and source file rows are determined as an intermediate match at 606 and the genome-based delta compression program 110a, 110b moves down the row to compare the REF and ALT of the next row of the source and target files at 608.

If the genome-based delta compression program 110a, 110b determines that the REF and ALT of the rows match at 608, then the genome-based delta compression program 110a, 110b determines that the target and source file rows are a match at 612 and the comparison of the rows of the target and source file rows ends. A "m" for match is written in the resulting delta file.

If, however, the genome-based delta compression program 110a, 110b determines that the REF and ALT do not match at 608, then the genome-based delta compression program 110a, 110b determines that the target and source file rows are a mismatch at 610 and the hierarchical identification of the source and target files ends.

It may be appreciated that FIGS. 2-6 provide only an illustration of one embodiment and do not imply any limitations with regard to how different embodiments may be implemented. Many modifications to the depicted embodiment(s) may be made based on design and implementation requirements.

Figure 7:
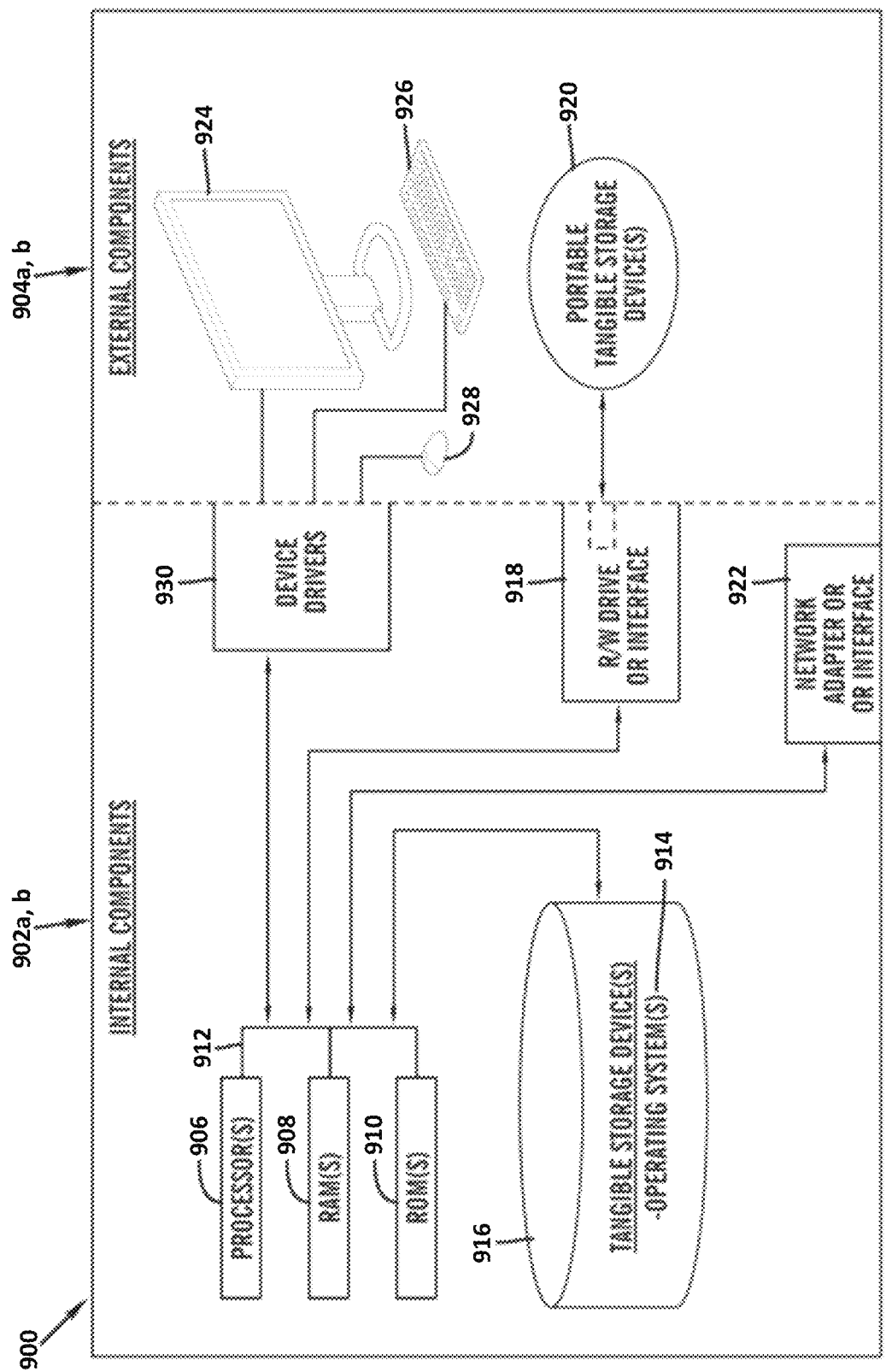
FIG. 7 is a block diagram of internal and external components of computers and servers depicted in FIG. 1 according to at least one embodiment.

FIG. 7 is a block diagram 900 of internal and external components of computers depicted in FIG. 1 in accordance with an illustrative embodiment of the present invention. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 and network server 112 may include respective sets of internal components 902 *a, b* and external components 904 *a, b* illustrated in FIG. 7. Each of the sets of internal components 902 *a, b* includes one or more processors 906, one or more computer-readable RAMs 908, and one or more computer-readable ROMs 910 on one or more buses 912, and one or more operating systems 914 and one or more computer-readable tangible storage devices 916. The one or more operating systems 914, the software program 108 and the genome-based delta compression program 110a in client computer 102, and the genome-based delta compression program 110b in network server 112, may be stored on one or more computer-readable tangible storage devices 916 for execution by one or more processors 906 via one or more RAMs 908 (which typically include cache memory). In the embodiment illustrated in FIG. 7, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902 *a, b* also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the genome-based delta compression program 110a and 110b can be stored on one or more of the respective portable computer-readable tangible storage devices 920, read via the respective R/W drive or interface 918, and loaded into the respective hard drive 916.

Each set of internal components 902 *a, b* may also include network adapters (or switch port cards) or interfaces 922 such as a TCP/IP adapter cards, wireless Wi-Fi interface cards, or 3G or 4G wireless interface cards or other wired or wireless communication links. The software program 108 and the genome-based delta compression program 110a in client computer 102 and the genome-based delta compression program 110b in network server computer 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the genome-based delta compression program 110a in client computer 102 and the genome-based delta compression program 110b in network server computer 112 are loaded into the respective hard drive 916. The network may comprise copper wires, optical fibers, wireless transmission, routers, firewalls, switches, gateway computers and/or edge servers.

Each of the sets of external components 904 *a, b* can include a computer display monitor 924, a keyboard 926, and a computer mouse 928. External components 904 *a, b* can also include touch screens, virtual keyboards, touch pads, pointing devices, and other human interface devices. Each of the sets of internal components 902 *a, b* also includes device drivers 930 to interface to computer display monitor 924, keyboard 926, and computer mouse 928. The device drivers 930, R/W drive or interface 918, and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
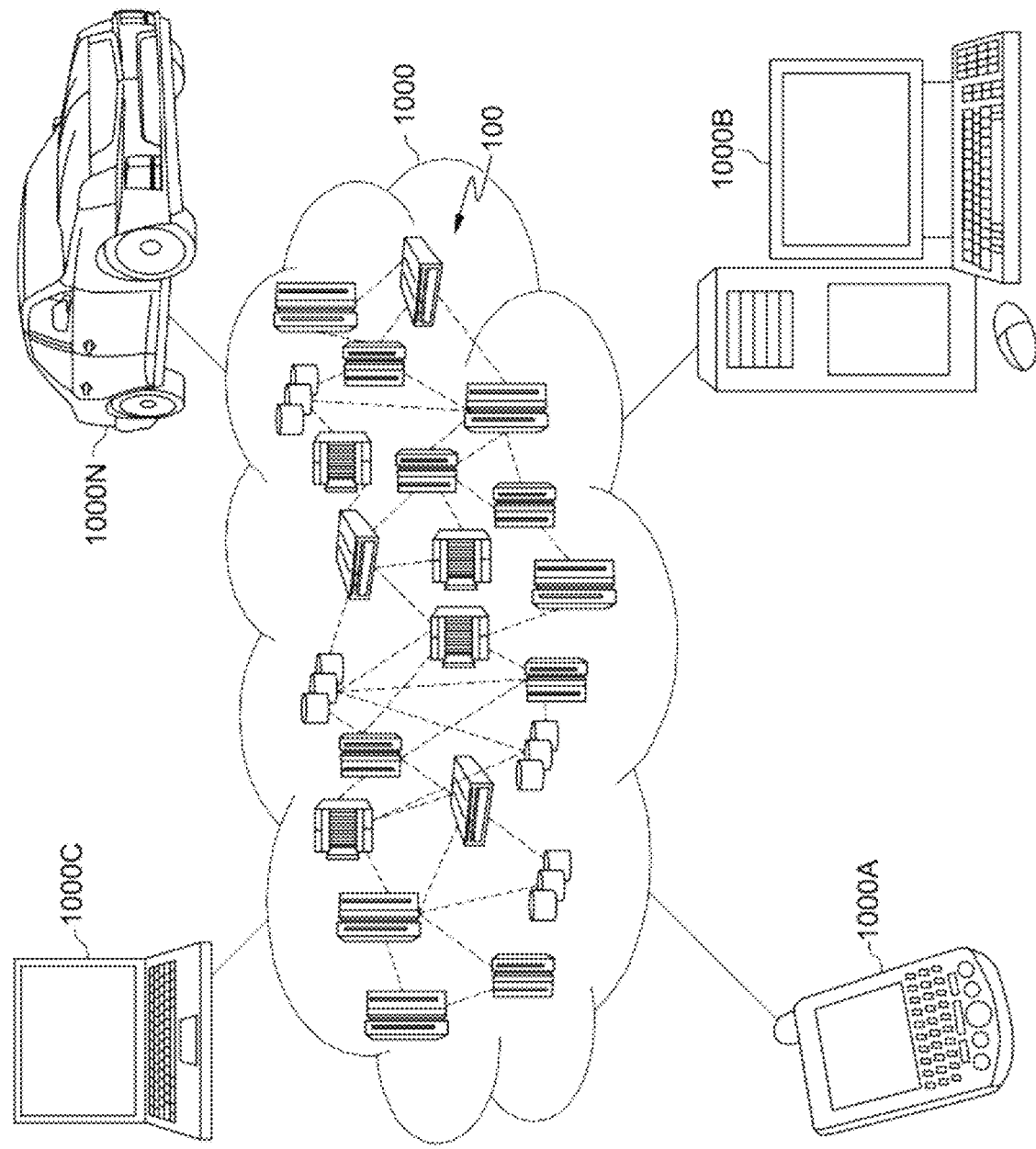
FIG. 8 is a block diagram of an illustrative cloud computing environment including the computer system depicted in FIG. 1, in accordance with an embodiment of the present disclosure.

Referring now to FIG. 8, illustrative cloud computing environment 1000 is depicted. As shown, cloud computing environment 1000 comprises one or more cloud computing nodes 100 with which local computing devices used by cloud consumers, such as, for example, personal digital assistant (PDA) or cellular telephone 1000A, desktop computer 1000B, laptop computer 1000C, and/or automobile computer system 1000N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 8 are intended to be illustrative only and that computing nodes 100 and cloud computing environment 1000 can communicate with any type of computerized device over any type of network and/or network addressable connection (e.g., using a web browser).

Figure 9:
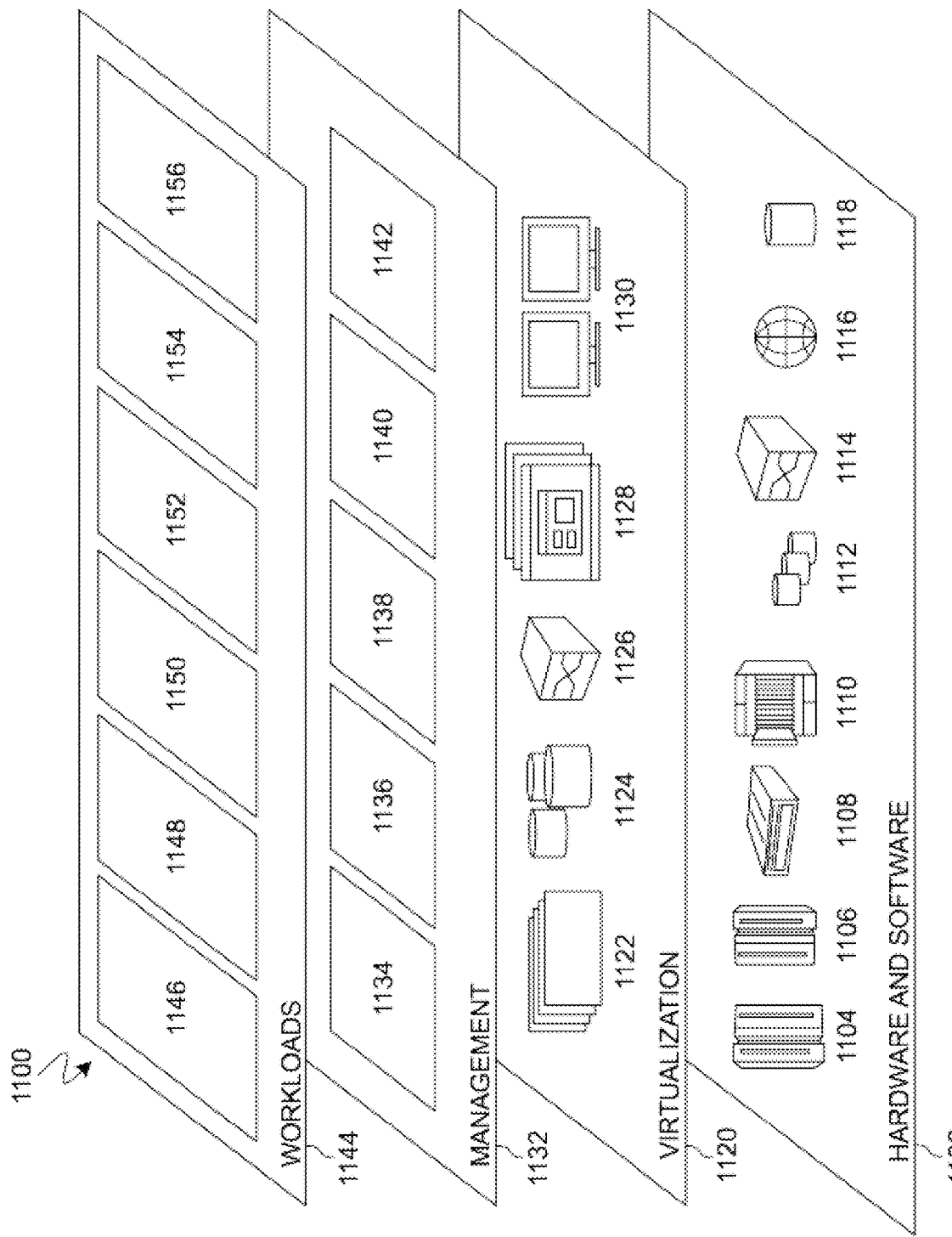
FIG. 9 is a block diagram of functional layers of the illustrative cloud computing environment of FIG. 8, in accordance with an embodiment of the present disclosure.

Referring now to FIG. 9, a set of functional abstraction layers 1100 provided by cloud computing environment 1000 is shown. It should be understood in advance that the components, layers, and functions shown in FIG. 9 are intended to be illustrative only and embodiments of the invention are not limited thereto. As depicted, the following layers and corresponding functions are provided:

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and genome-based delta compression 1156. A genome-based delta compression program 110*a*, 110*b* provides a way to compress delta files for genomic data files.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for compressing at least one delta file for genomic data files, the method comprising:
   receiving a first file and a second file as input, the first file and the second file belonging to the genomic data files, wherein both the first file and the second file are tab delimited such that each row of the first file comprises first file fields and each row of the second file comprises second file fields, wherein the first file includes first data from a reference genome associated with a first specimen, and wherein the second file includes second data from another genome associated with a second specimen that is different from the first specimen;
   determining sorted rows of the received first file and a corresponding sorted rows of the received second file by traversing the received first file and the received second file, the sorted rows and the corresponding sorted rows being arranged with an increasing order of a mapping position in a genome;
   comparing the first file fields of the sorted rows with corresponding second file fields of the corresponding sorted rows;
   generating a resulting delta file based on the comparing; and
   compressing the generated resulting delta file by utilizing a general purpose file compressor;
   wherein the resulting delta file is formatted to be utilized with the first file to reconstruct the second file.

2. The method of claim 1, further comprising:
   storing the compressed resulting delta file onto a user device; and
   presenting the compressed resulting delta file to the user.

3. The method of claim 1, wherein the first file comprises at least one source file; and
   wherein the second file comprises at least one target file.

4. The method of claim 1, further comprising:
   determining the received first file and the received second file are unsorted; and
   sorting each of the rows within the received first and second files utilizing a sorting tool.

5. The method of claim 1, further comprising:
   determining that the received first and second files are in a compatible format.

6. The method of claim 1, further comprising:
   storing at least two rows of the corresponding sorted rows of the received second file in a buffer in preparation for the comparing of the first file fields of the sorted rows of the received first file with the corresponding second file fields of the corresponding sorted rows of the received second file.

7. The method of claim 1, wherein the first file fields comprise respective first columns, wherein the second file fields comprise respective second columns, and wherein the comparing the first file fields of the sorted rows of the first file with the corresponding second file fields of the corresponding sorted rows of the second file further comprises:
   comparing the first columns with corresponding ones of the second columns; and
   generating the resulting delta file based on the comparing of the first columns with the corresponding ones of the second columns.

8. The method of claim 7, wherein the comparing of the first columns with the corresponding ones of the second columns further comprises:
   determining whether priority columns of the first columns match preeminent columns of the second columns; and
   in response to a determination that the priority columns of the first columns match the preeminent columns of the second columns, comparing additional columns of the first columns to corresponding further columns of the second columns.

9. A computer system for compressing at least one delta file for genomic data files, comprising:
   one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
   receiving a first file and a second file as input, the first file and the second file belonging to the genomic data files, wherein both the first file and the second file are tab delimited such that each row of the first file comprises first file fields and each row of the second file comprises second file fields, wherein the first file includes first data from a reference genome associated with a first specimen, and wherein the second file includes second data from another genome associated with a second specimen that is different from the first specimen;
   determining sorted rows of the received first file and corresponding sorted rows of the received second file by traversing the received first and second files, the sorted rows and the corresponding sorted rows being arranged with an increasing order of a mapping position in a genome;
   comparing the first file fields of the sorted rows with corresponding second file fields of the corresponding sorted rows;
   generating a resulting delta file based on the comparing; and
   compressing the generated resulting delta file by utilizing a general purpose file compressor;
   wherein the resulting delta file is formatted to be utilized with the first file to reconstruct the second file.

10. The computer system of claim 9, wherein the method further comprises:
    storing the compressed resulting delta file onto a user device; and
    presenting the compressed resulting delta file to the user.

11. The computer system of claim 9, wherein the first file comprises at least one source file; and
    wherein the second file comprises at least one target file.

12. The computer system of claim 9, wherein the method further comprises:
    determining the received first file and the received second file are unsorted; and
    sorting each of the rows within the received first and second files utilizing a sorting tool.

13. The computer system of claim 9, wherein the method further comprises:
    determining that the received first and second files are in a compatible format.

14. The computer system of claim 9, wherein the method further comprises:
    storing at least two rows of the corresponding sorted rows of the received second file in a buffer in preparation for the comparing of the first file fields of the sorted rows with the corresponding second file fields of the corresponding sorted rows.

15. The computer system of claim 9, wherein the first file fields comprise respective first columns, wherein the second file fields comprise respective second columns, and wherein the comparing the first file fields of the sorted rows of the first file with the corresponding second file fields of the corresponding sorted rows of the second file further comprises:
   comparing the first columns with corresponding ones of the second columns; and
   generating the resulting delta file based on the comparing of the first columns with the corresponding ones of the second columns.

16. The computer system of claim 15, wherein the comparing the first columns with the corresponding ones of the second columns further comprises:
   determining whether priority columns of the first columns match preeminent columns of the second columns; and
   in response to a determination that the priority columns of the first columns match the preeminent columns of the second columns, comparing additional columns of the first columns to corresponding further columns of the second columns.

17. A computer program product for compressing at least one delta file for genomic data files, comprising:
   one or more computer-readable storage media and program instructions stored on at least one of the one or more tangible storage media, the program instructions executable by a processor to cause the processor to perform a method comprising:
      receiving a first file and a second file as input, the first file and the second file belonging to the genomic data files, wherein both the first file and the second file are tab delimited such that each row of the first file comprises first file fields and each row of the second file comprises second file fields, wherein the first file includes first data from a reference genome associated with a first specimen, and wherein the second file includes second data from another genome associated with a second specimen that is different from the first specimen;
      determining sorted rows of the received first file and corresponding sorted rows of the received second file by traversing the received first and second files, the sorted rows and the corresponding sorted rows being arranged with an increasing order of a mapping position in a genome;
      comparing the first file fields of the sorted rows with corresponding second file fields of the corresponding sorted rows;
      generating a resulting delta file based on the comparing; and
      compressing the generated resulting delta file by utilizing a general purpose file compressor;
   wherein the resulting delta file is formatted to be utilized with the first file to reconstruct the second file.

18. The computer program product of claim 17, wherein the method further comprises:
   storing the compressed resulting delta file onto a user device; and
   presenting the compressed resulting delta file to the user.

19. The computer program product of claim 17, wherein the first file comprises at least one source file; and
   wherein the second file comprises at least one target file.

20. The computer program product of claim 17, wherein the method further comprises:
   determining the received first file and the received second file are unsorted; and
   sorting each of the rows within the received first and second files utilizing a sorting tool.

\* \* \* \* \*